(12) United States Patent
Yap et al.

(10) Patent No.: US 8,741,666 B1
(45) Date of Patent: Jun. 3, 2014

(54) METHODS RELATING TO INTERMETALLIC TESTING OF BOND INTEGRITY BETWEEN BOND PADS AND COPPER-CONTAINING BOND WIRES

(71) Applicants: Weng F Yap, Phoenix, AZ (US); Lai Cheng Law, Selangor (MY); Boh Kid Wong, Perak (MY)

(72) Inventors: Weng F Yap, Phoenix, AZ (US); Lai Cheng Law, Selangor (MY); Boh Kid Wong, Perak (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/766,445

(22) Filed: Feb. 13, 2013

(51) Int. Cl.
*H01L 21/66* (2006.01)

(52) U.S. Cl.
USPC .......................................................... 438/15

(58) Field of Classification Search
None
See application file for complete search history.

(56) References Cited

U.S. PATENT DOCUMENTS

2011/0011618 A1* 1/2011 Uno et al. ................. 174/126.1

* cited by examiner

*Primary Examiner* — Scott B Geyer
(74) *Attorney, Agent, or Firm* — Ingrassia Fisher & Lorenz, P.C.

(57) ABSTRACT

Methods relating to intermetallic compound testing of copper-based wire bonds are provided. For example, a method is generally provided for testing the integrity of wire bonds formed between copper-containing wires and the bond pads of a plurality of microelectronic devices. In one embodiment, the method includes selecting at least one wire bond sample produced in conjunction with the wire bonds formed between the copper-containing wires and the bond pads of the microelectronic devices. One or more copper-containing wires of the wire bond sample are contacted with a liquid copper etchant, which contains a sulfate-based oxidizing agent dissolved in a solvent, to cause separation of the copper-containing wires from the bond pads and exposure of the underlying wire-pad interfaces. Intermetallic compounds formed at the exposed wire-pad interfaces are then measured to assess the integrity of the wire bonds.

20 Claims, 2 Drawing Sheets

US 8,741,666 B1

METHODS RELATING TO INTERMETALLIC TESTING OF BOND INTEGRITY BETWEEN BOND PADS AND COPPER-CONTAINING BOND WIRES

TECHNICAL FIELD

Embodiments of the present invention relate generally to the production and packaging of microelectronic devices and, more particularly, to methods relating to testing the integrity of wire bonds formed between copper-containing wires and the bond pads of microelectronic devices.

BACKGROUND

Wire bonding is employed to form the electrical interconnections for various different types of microelectronic devices, such as integrated circuits formed on semiconductor die, microelectromechanical systems, passive electronic components, and optical devices. Wire bonding can be utilized to interconnect a microelectronic device to a printed circuit board, a printed wiring board, a leadframe, or the like. Wire bonding can also be utilized to form electrical connections between the device bond pads and electrical conductors included within a two dimensional or three dimensional package containing one or more microelectronic devices. For example, in the case of a Redistributed Chip Package (RCP), wire bonding can be utilized to join the device bond pads to the conductors formed in the RCP layers, which may be, in turn, electrically coupled to a ball grid array formed over the bottom surface of the package.

In one common type of wire bonding, referred to as "ball bonding," a wire is fed through a specialized tool referred to as a "capillary." For each wire bond connection, the wire is melted as it emerges through the tip of the capillary and forms a ball-shaped body, which is welded to the bond pad via the application of ultrasonic or thermosonic energy. The capillary then moves away from the ball bond while additional wire is let-out to form the elongated body of the bond wire. To complete the connection, the opposing terminal end of the bond wire is bonded to the contact provided on or included within a leadframe, printed circuit board, microelectronic device package, or the like. Traditionally, gold has been the predominate metal utilized in ball bonding and other types of wire bonding. However, the usage of copper wires in wire bonding has recently become more common in view of the lower electrical resistivity and lower cost of copper as compared to gold and other wire bond materials.

BRIEF DESCRIPTION OF THE DRAWINGS

At least one example of the present invention will hereinafter be described in conjunction with the following figures, wherein like numerals denote like elements, and.

Figure 1:
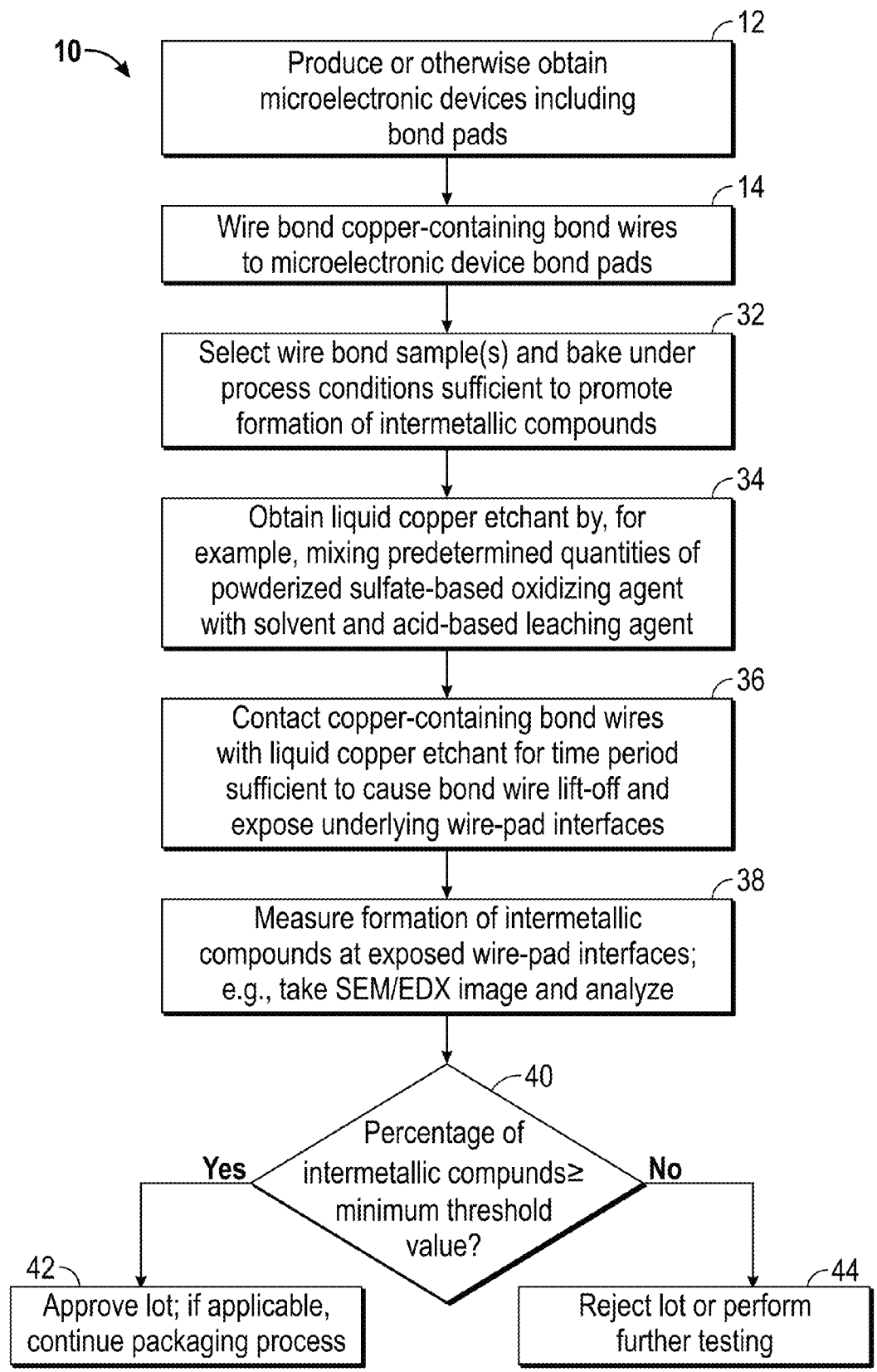
FIG. 1 is a flowchart illustrating a method for testing the integrity of wire bonds formed between copper-containing wires and the bond pads of microelectronic devices based at least partially upon the presence of intermetallic compounds, as illustrated in accordance with an exemplary and non-limiting embodiment of the present invention.

For simplicity and clarity of illustration, the drawing figures illustrate the general manner of construction and may omit depiction, descriptions, and details of well-known features and techniques to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

As appearing herein, the term "microelectronic device" is utilized in a broad sense to refer to an electronic device, element, or component produced on a relatively small scale and amenable to electrical interconnection by wire bonding. Microelectronic devices include, but are not limited to, integrated circuits (ICs) formed on semiconductor die, microelectromechanical systems (MEMS), passive electronic components, optical devices, and other small scale electronic devices capable of providing processing, memory, sensing, radiofrequency, optical, and actuator functionalities, to list but a few examples. Furthermore, reference to metals, as appearing herein, encompass highly pure metals, as well as alloys in which the named metal is the primary constituent, by weight or atomic percentage. Thus, as an example, reference to an aluminum bond pad encompasses a bond pad consisting essentially of pure aluminum, as well as a bond pad formed from an alloy wherein aluminum is the primary constituent. Similarly, hyphenated terms identifying two or more metals are utilized to refer to alloys in which the named metals are the primary constituents, with either the first or second named metal comprising a greater percentage of the alloy. Thus, as an example, a bond wire formed from an alloy containing copper and palladium as its two major constituents may be referred to herein as a "copper-palladium bond wire" or, more simply, as a "copper-palladium wire."

As noted in the foregoing section entitled "BACKGROUND," the usage of copper wires in wire bonding has recently become more common in view of the lower resistivity and lower cost of copper as compared to gold and other wire bond materials. Copper wires may also provide benefits in mechanical strength and durability as compared to certain other wire bond materials. However, in instances wherein copper bond wire is joined to non-copper bond pads (or bond pads containing copper, but having a disparate metallic composition as compared to the copper bond wires), the integrity of the wire-pad or ball-pad bond joint can be affected by the formation of intermetallic compounds ("IMCs"), which gradually grow at the wire-pad or ball-pad interface during usage of the microelectronic devices. Within certain limits, the presence of interfacial IMCs at the wire-pad or ball-pad interface is indicative of the formation of a relatively strong metallurgical and/or mechanical bond. Furthermore, the formation of interfacial IMCs at the wire-pad or ball-pad interface may help augment bond strength to a certain extent. However, excessive IMC formation at the wire-pad or ball-pad interface can also negatively affect the integrity of the bond joint by, for example, increasing the resistance across the bond joint thereby leading to the creation of high resistance, localized "hot spots" in the microelectronic devices. In general, it is desired for optimal ball bond or bond joint integrity to achieve a relatively high IMC coverage percentage across the surface of the wire-pad or ball-pad interface, while minimizing the thickness of the IMC layer. IMC coverage may be determine utilizing spectral analysis of the type described below in conjunction with STEP 38 of exemplary method 10 (FIG. 1), while IMC thickness can be visually determined by darkness of the interfacial through general optical scope, the precise thickness measurement could be determined by cross-sectioning the bond joint and measuring the scanning electron microscope image, as also described more fully below.

The following describes embodiments of a method for testing wire bond integrity, which may be in performed in conjunction with the production and/or packaging of ICs, MEMS, or other microelectronic devices. For example, embodiments of the below-described method can be carried-out during microelectronic device packaging to assess the integrity of wire bonds formed between copper-containing bond wires and their corresponding bond pads, which are composed of a material different than the wire bond material and thus subject to the gradual formation of intermetallic compounds at the wire-pad interfaces (also referred to as the "ball-pad interfaces" in embodiments wherein ball bonding is performed). Wire bond integrity is assessed, at least in part, by measuring the formation of IMCs at the wire-pad or ball-pad interfaces for one or more wire bond samples, which have been thermally treated or baked to promote accelerated IMC formation in the below-described manner. To enable accurate measurement of the formation of IMCs at the wire-pad or ball-pad interfaces, separation or lift-off of the bond wires from their corresponding bond pads is typically required. One manner in which bond wire lift-off can be achieved is through the controlled etching of the copper-containing bond wires at the wire-pad or ball-pad interface. A nitric acid-based solution, for example, can be utilized as a copper etchant that, when applied to the bond joint, may etch away the copper and result in bond wire lift-off and exposure of the underlying bond pad. Nitric acid-based solutions are, however, hazardous by nature and can be relatively costs in their use and disposal. Additionally, nitric acid-based solutions, even when relatively dilute, can have an undesirably high copper etch rate increasing the likelihood of over-etching of the bond joint rendering IMC testing less reliable. In contrast, embodiments of the below-described IMC testing method employ a nitric acid-free copper etch chemistry containing a sulfate-based oxidizing agent, which is less hazardous and can be formulated to have a lower copper etch rate relative to comparable nitric-acid based etchants. Usage of a such nitric acid-free copper micro-etchant thus enables reductions in the amounts of hazardous materials produced and the testing costs incurred, while also providing more reliable IMC test results by eliminating or minimizing over-etching at the tested bond joints.

FIG. 1 is a flowchart setting-forth a method 10 for testing wire bond integrity, which may be in performed in conjunction with the production of ICs, MEMS, or other microelectronic devices. As shown in FIG. 1 and described in detail below, method 10 is offered by way of non-limiting example only. It is emphasized that the fabrication steps shown in FIG. 1 can be performed in alternative orders, that certain steps may be omitted, and that additional steps may be performed in further embodiments. Furthermore, various steps in the manufacture of microelectronic devices and microelectronic devices packages are well-known and, in the interests of brevity, will only be mentioned briefly herein or will be omitted entirely without providing the well-known process details.

To commence exemplary method 10 (FIG. 1), a number of microelectronic devices are obtained (STEP 12). The microelectronic devices can be obtained by purchase from a supplier or by independent fabrication. The microelectronic devices obtained during STEP 12 each include a number of bond pads, which may be arranged in a grid array across an upper or lower surface of the devices in an embodiment. The term "bond pad" is utilized herein to denote any electrically-conductive contact region or body to which a wire bond can be joined utilizing ball bonding or other wire bonding process. Embodiments of method 10 are useful in instances wherein the microelectronic device bond pads are formed from a material having a metallic composition different than that of the copper-containing bond wires, as described more fully below in conjunction with STEP 14 of exemplary method 10. A non-exhaustive list of materials from which the microelectronic device bond pads may be formed includes aluminum, copper, nickel-palladium, and gold, with each of the aforementioned metals including relatively pure materials, as well as alloys in which the named metal or metals are the primary constituent or constituents. In one embodiment, the microelectronic devices obtained during STEP 12 each include a plurality of aluminum bond pads.

Exemplary method 10 continues with the performance of wire bonding (STEP 14). Ball bonding is preferably performed during STEP 14, and exemplary method 10 will consequently be described below primarily in conjunction with ball bonding. This notwithstanding, it is emphasized that other wire bonding processes can be carried-out during exemplary method 10 including, for example, wedge bonding. Such wire bonding processes are well-established and will thus not be described in detail herein. It is noted, however, that copper-containing bond wire is utilized in the wire bonding process (STEP 14) so as to provide the above-noted benefits. The term "copper-containing bond wire" is utilized herein to denote bond wire that includes non-trace amounts of copper as at least one of its metallic constituents in sufficient quantity to form IMCs with the non-copper bond pad material or materials over the operational lifespan of the microelectronic device. The copper-containing wire may be fabricated from highly pure copper (that is, copper having a purity exceeding 99.9%, by weight) and/or a copper alloy (that is, an alloy containing copper as its primary constituent). In one embodiment, the copper-palladium bond wire is utilized; that is, bond wire formed from an alloy containing copper and palladium as its primary constituents.

Figure 2:
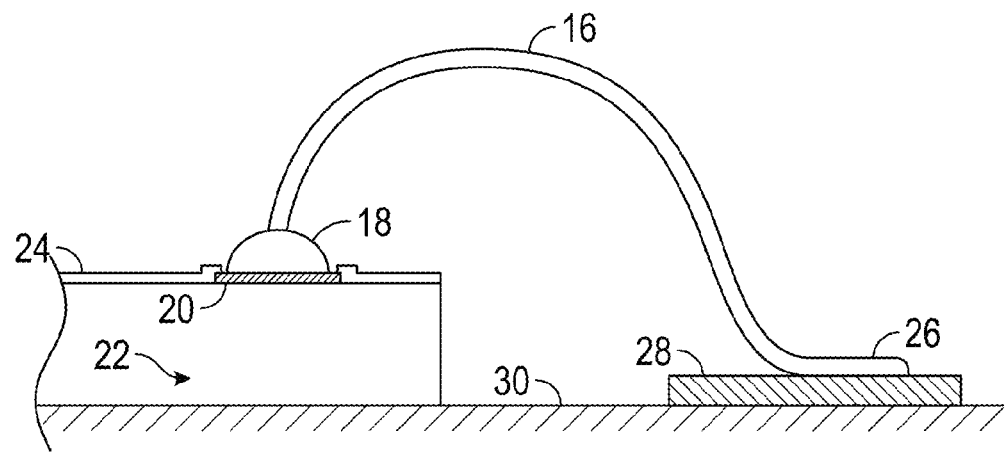
FIG. 2 is a simplified cross-sectional view of a microelectronic device (partially shown) including a bond wire connection that may be formed during the exemplary method shown in FIG. 1.

FIG. 2 is a simplified cross-sectional view a bond wire connection 16 that may be formed during STEP 14 of exemplary method 10 (FIG. 1). In the illustrated example, bond wire connection 16 includes a ball bond 18, which is welded or otherwise bonded to a bond pad 20 provided on a microelectronic device 22, such as an IC die or MEMS device. Bond pad 20 is exposed through an opening provided in a passivation layer 24. As noted above, bond pad 20 may be fabricated from any one of a number of different metals or alloys. In one embodiment, bond pad 20 is an aluminum bond pad. The opposing terminal end 26 of bond wire 16 is welded to a contact 28 provided on or formed in a substrate or supportive body 30, which also supports microelectronic device 22. As is ball bond 18, terminal end 26 of bond wire 16 may be welded to its respective contact through the application of ultrasonic or thermosonic energy, although terminal bond wire end 26 will typically not have a ball shape. As generically illustrated in FIG. 2, contact 28 and supportive body 30 are intended to encompass traces, metal lines, bond pads, and other such electrically-conductive elements provided on or included within printed circuit boards, printed wiring boards, leadframes, and the like; as well as any electrically-conductive element included within a microelectronic device package, such as a metal line provided in the RCP layers of a packaged microelectronic device produced utilizing an RPC packaging process.

With continued reference to exemplary method 10 shown in FIG. 1, one or more wire bond samples are selected for baking and subsequent IMC bond integrity testing (STEP 32). The wire bond samples selected during STEP 32 will typically be non-functional dummy devices processed in parallel with the fully-functioning microelectronic devices during wire bonding and likewise including bond pads substantially identical to those included in the fully-functioning microelectronic devices; however, the possibility that the wire bond samples selected during STEP 32 are fully-functioning microelectronic device selected at random from the production lot is by no means precluded. The selected wire bond samples are subject to high temperature processing or baking process performed under process conditions sufficient to accelerate the formation of IMCs at the wire-pad or ball-pad junctures and thus mimic IMC growth levels that would occur gradually over the operational lifespan of the microelectronic devices. The particular parameters of the baking process will vary based upon the composition of the bond wire, the composition of the bond pads, and other such factors. However, by way of non-limiting example, the bond wires may be heated to a temperature between about 175° C. and about 225° C. for a time period between about 2.5 hours and about 5 hours during the baking process.

Continuing with exemplary method 10 shown in FIG. 1, a liquid chemical etchant selective to copper is obtained (STEP 34). The liquid chemical etchant is referred to herein as a "liquid copper etchant" and may also be referred to as a "micro-etchant" in view of its comparably low etch rate relative to a nitric acid-based etchant (e.g., 65% $HNO_3$ solution) allowing relatively precise, micron-level removal of copper. The liquid copper etchant is free of nitric acid and, instead, contains a sulfate-based oxidizing agent dissolved in a solvent. The sulfate-based oxidizing agent serves as the active etchant agent by reacting with copper to produce coppersulfate and water byproducts. In preferred embodiments, the liquid copper etchant also contains a leaching agent or acid different than the sulfate-based oxidizing agent. In such embodiments, the leaching agent may function to extract minerals (e.g., the sulfate-based oxidizing agent) from the solid materials thereby facilitating dissolution of such minerals into the carrier liquid, which may be deionized water. Suitable sulfate based-oxidizing agents include, but are not limited to, ammonium persulfate (($NH_4)_2S_2O_8$), sodium peroxymonosulfate ($NaHSO_5$), potassium peroxymonosulfate ($HKO_6S$), and sodium persulfate ($Na_2S_2O_8$). Examples of a suitable leaching agent and solvent include, but are not limited to, sulfuric acid and deionized water, respectively. In one embodiment, the liquid copper etchant comprises a mixture of ammonium persulfate and nitric acid dissolved in water.

The liquid copper etchant is conveniently prepared by adding the selected sulfate-based oxidizing agent, in powder form, to a container holding the solvent. If included in the liquid copper etchant, nitric acid or another leaching agent may then be added in liquid form to the yield the final solution, which may be agitated to promote full dissolution of the etchant powder. The particular formulation and relative proportions of the liquid copper etchant will inevitably vary amongst different embodiments. However, in one embodiment wherein the solvent comprises water and wherein the liquid copper etchant contains a leaching agent, the liquid copper etchant is formulated to contain about 0.01 gram to about 1.0 gram of the sulfate-based oxidizing agent, as added in powder form, for every milliliter of water contained therein, with the sulfate-based oxidizing agent preferably comprising ammonium persulfate; and about 0.01 milliliter to about 0.25 milliliter of the leaching agent for every milliliter of water contained therein, with leaching agent preferably comprising sulfuric acid.

Next, at STEP 36 of exemplary method 10 (FIG. 1), the copper-containing bond wires of the baked wire bond samples are contacted with the liquid copper etchant. In particular, the copper-containing bond wires are treated with the liquid copper etchant in sufficient volume and for a time period sufficient to cause lift-off of the bond wires from the bond pads and exposure of the underlying wire-pad or ball-paid interfaces. The liquid copper etchant is conveniently applied during STEP 36 utilizing a dropper or pipet; e.g., drops of the liquid copper etchant may be repeatedly applied until lift-off or separation of the bond wires occurs. After bond wire lift-off has been achieved, the presence of IMCs at the exposed wire-pad interfaces is then measured (STEP 38). As indicated in FIG. 1, the IMC level (also referred to herein as the "IMC percentage") at the wire-pad interfaces can be measured by first imaging the interfaces utilizing, for example, a Scanning Electron Microscope (SEM) or a Energy-Dispersive X-ray (EDX) spectroscopy tool. The images may then be analyzed utilizing spectral analysis software to estimate the elemental make-up of the wire-pad interfaces and, specifically, the presence of one or more copper-containing IMC species. For example, in the case of copper or copper-palladium wires joined to aluminum bond pads, the atomic and/or weight percentage of Cu—Al intermetallic compounds may be measured. In one embodiment, the IMC coverage across the exposed wire-pad or ball-pad interfaces is measured utilizing software, which distinguishes the IMC area based upon the lightness of shading (essentially comparing white and black regions) to calculate the IMC area (generally, black in coloration) as compared to the non-IMC area (non-black in color).

If the measured IMC percentage is less than a predetermined minimal IMC threshold value (e.g., about 50% to about 60%, by weight), the production lot may be rejected or further testing may be performed (STEPS 40 and 44). Alternatively, if the measured IMC percentage exceeds or is equal to a minimal IMC threshold value, the production lot may be approved; and, in embodiments wherein a microelectronic device is subject to packaging, the packaging process may proceed (STEPS 40 and 42). In this latter case, the particular steps performed to complete packaging will, of course, vary depending upon the particular packaging technology employed. In many instances, additional packaging steps will include encapsulation of the microelectronic device or devices and, in the case of a Wire Bond (WB) Ball Grid Array (BGA), Redistributed Chip Package (RCP) package, or the like may also include the formation of a number of RCP layers and subsequent bumping. The production lot may also be rejected or subject to further testing if the IMC percentage exceeds a predetermined upper threshold value in certain embodiments.

Example of Method Reduced to Practice/Proof of Concept

By way of illustration and not of limitation, the following describes an experiment performed in evaluating the effectiveness of the above-described nitric acid-free liquid copper etchant as compared to a 65% nitric acid etchant solution. To begin, a number of nitric acid-free liquid copper etchants were prepared. For each nitric acid-free liquid copper etchant, between 1 and 2 grams of copper etch powder was added into 1 millimeter of deionized water held in individual beakers. Two etch powders were tested in this case: (i) ammonium persulfate, obtained as "CU85" from the global supplier Technic, Inc.; and (ii) sodium persulfate, obtained as "AT2000" from the same supplier. One drop of sulfuric acid was then added to each beaker, and the resulting solution was then agitated to promote full dissolution of the etch powders in the water solvents.

Figure 3:
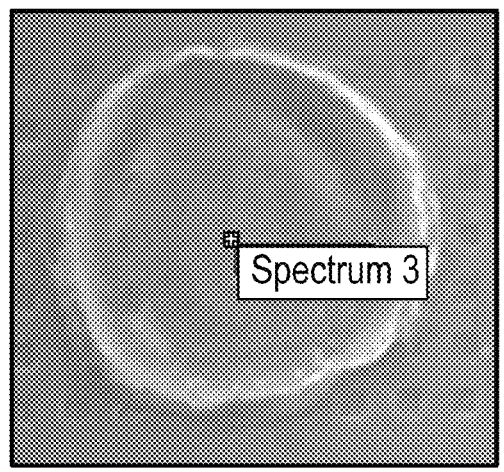
FIGS. 3 and 4 are scanning electron microscope images of a pad-wire interface wire taken subsequent to bond wire lift-off due to treatment of the copper-containing bond wires with a sulfate-containing copper etchant and a nitric acid-based copper etchant, respectively.
Figure 4:
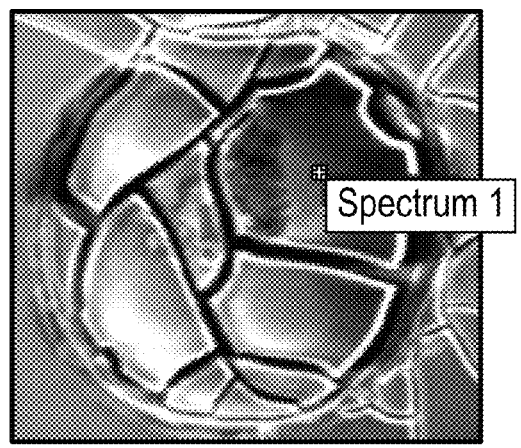

A first group of wire bond samples was baked at about 175° C. for about 5 hours, and a second group of wire bond samples was baked at about 225° C. for about 2.5 hours. For each nitric acid-free liquid copper etchants, several drops of the etchant solution were applied to at least one of the baked wire bond sample from each group until bond wire lift off from the bond pads was achieved. After a predetermined etch time of twenty seconds, the wire bond samples were then washed-off with deionized water. A similar process was also carried-out utilizing the 65% nitric acid etchant solution, but with acetone utilized to wash-off the liquid etchant. Scanning Electron Microscope (SEM) images were then taken and analyzed. By way of example, FIG. 3 is an SEM image of a wire bond sample treated with a nitric-free liquid copper etchant containing ammonium persulfate, and FIG. 4 is an SEM image of wire bond sample treated with the 65% nitric acid etchant solution. As can be seen, little to no over-etching of the wire bond sample shown in FIG. 3 has occurred; while significant over-etching of the wire bond sample shown in FIG. 4 (as indicated by cracking) has occurred. As a result, the wire bond sample shown in FIG. 3 was able to provide more reliable spectral IMC analysis. Additionally, as noted above, the nitric-acid free liquid copper etchant utilized to produce the wire bond sample shown in FIG. 3 is less hazardous, and therefore less costly to use, than are nitric-acid based etchants.

The foregoing has thus provided embodiments of a method for testing wire bond integrity, which may be in performed in conjunction with the production and/or packaging of ICs, MEMS, or other microelectronic devices. Wire bond integrity is assessed, at least in part, by measuring the formation of IMCs at the wire-pad (that is, in the case of ball bonding, at the ball-pad interfaces) for one or more wire bond samples. Advantageously, embodiments of the above-described IMC testing method employ a nitric acid-free copper etch chemistry containing a sulfate-based oxidizing agent, which is less hazardous and/or may have a lower copper etch rate relative to comparable nitric-acid based etchants. Usage of a such nitric acid-free copper micro-etchant thus enables the amounts of hazardous materials and the costs of testing to be reduced, while also providing more reliable IMC test results by eliminating or at least reducing undesired over-etching of the bond joints.

In one embodiment, the above-described method includes selecting at least one wire bond sample produced in conjunction with the wire bonds formed between the copper-containing wires and the bond pads of the microelectronic devices. One or more copper-containing wires of the wire bond sample are contacted with a liquid copper etchant, which contains a sulfate-based oxidizing agent dissolved in a solvent, to cause separation of the copper-containing wires from the bond pads and exposure of the underlying wire-pad interfaces. Intermetallic compounds formed at the exposed wire-pad interfaces are then measured to assess the integrity of the wire bonds.

In a further embodiment, the above-described method includes ball bonding copper-containing wires to a plurality of bond pads included within a plurality of microelectronic devices. The copper-containing wires comprised of a different material than are the plurality of bond pads; that is, the copper-containing wires having a different metallic formulation than do the plurality of bond pads, which may also contain copper in certain embodiments. At least one bond wire sample produced in conjunction with the plurality of microelectronic devices is then selected for ball bond integrity testing. The integrity of one or more ball bonds of the at least one bond wire sample is then tested by: (i) contacting one or more copper-containing wires of the at least one bond wire sample with a liquid copper etchant to separate the copper-containing wires from the bond pads and expose the wire-pad interfaces, the liquid copper etchant comprising a sulfate-based oxidizing agent, an acid different than the sulfate-based oxidizing agent, and a solvent; and (ii) estimating the percentage of the exposed wire-pad interfaces covered by intermetallic compounds. If the percentage of the intermetallic compounds exceeds the predetermined threshold value, the plurality of microelectronic devices are packaged utilizing, for example, an RCP packaging process. Conversely, if the percentage of the intermetallic compounds is equal to or less than the predetermined threshold value, the lot of microelectronic devices may be rejected and packaging may not be performed.

In a still further embodiment, the above-described method includes selecting at least one wire bond sample produced in conjunction with the wire bonds formed between the copper-containing wires and the bond pads of the plurality of microelectronic devices. The at least one wire bond sample is then baked to promote the formation of intermetallic compounds at the wire-pad interfaces. A sulfate-containing etchant are the applied (e.g., in droplet form) to the at least one wire bond sample at the wire-pad interfaces thereof until the copper-containing wires lift from the bond pads and expose the wire-pad interfaces. At least one image of the exposed wire-pad interfaces is then generated and analyzed to estimate the percentage of the intermetallic compounds present at the exposed wire-pad interfaces and thereby assess the integrity of the wire bonds formed between the copper-containing and the bond pads of the plurality of microelectronic devices.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for testing the integrity of wire bonds formed between copper-containing wires and the bond pads of a plurality of microelectronic devices, the bond pads of the plurality of microelectronic devices fabricated from a metallic material different than the copper-containing wires, the method comprising:
   selecting at least one wire bond sample produced in conjunction with the wire bonds formed between the copper-containing wires and the bond pads of the plurality of microelectronic devices;
   contacting one or more copper-containing wires of the wire bond sample with a liquid copper etchant to cause separation of the copper-containing wires from the bond pads and exposure of the underlying wire-pad interfaces, the liquid copper etchant comprising a sulfate-based oxidizing agent dissolved in a solvent; and
   measuring the formation of intermetallic compounds at the exposed wire-pad interfaces to assess the integrity of the wire bonds formed between the copper-containing and the bond pads of the plurality of microelectronic devices.

2. The method of claim 1 wherein the at least one wire bond sample includes at least one of the group consisting of aluminum bond pads, copper bond pads, nickel-palladium bond pads, and gold bond pads.

3. The method of claim 2 wherein the at least one wire bond sample includes aluminum bond pads.

4. The method of claim 1 wherein the at least one wire bond sample includes copper-containing wires comprising at least one of the group consisting of pure copper wires and copper-palladium wires.

5. The method of claim 1 wherein the sulfate-based oxidizing agent comprises at least one of the group consisting of ammonium persulfate, sodium peroxymonosulfate, potassium peroxymonosulfate, and sodium persulfate.

6. The method of claim 5 wherein the sulfate-based oxidizing agent comprises ammonium persulfate.

7. The method of claim 1 wherein the liquid copper etchant further comprises a leaching agent.

8. The method of claim 5 wherein the liquid copper etchant is produced by mixing the sulfate-based oxidizing agent, in powder form, with the leaching agent and the solvent.

9. The method of claim 8 wherein the leaching agent comprises sulfuric acid and wherein the solvent comprises water.

10. The method of claim 9 wherein the liquid copper etchant is formulated to contain about 0.01 gram to about 1.0 gram of the sulfate-based oxidizing agent, in powder form, for every milliliter of water contained therein.

11. The method of claim 10 wherein the liquid copper etchant is formulated to contain about 0.01 milliliter to about 0.25 milliliter sulfuric acid for every milliliter of water contained therein.

12. The method of claim 1 further comprising, prior to contacting the copper-containing wires with the liquid copper etchant and exposing the wire-pad interfaces, baking the at least one bond wire sample at a predetermined elevated temperature for a predetermined time period sufficient to promote the formation of intermetallic compounds at the wire-pad interfaces.

13. The method of claim 12 wherein baking comprises heating the at least sample microelectronic device to a temperature between about 175° C. and about 225° C. for a time period between about 2.5 hours and about 5 hours.

14. The method of claim 1 wherein the liquid copper etchant is free of nitric acid.

15. The method of claim 1 further comprising flooding the exposed wire-pad interfaces with deionized water after contacting the copper-containing wires with the liquid copper etchant and prior to measuring the formation of intermetallic compounds at the exposed wire-pad interfaces.

16. A method, comprising:
   ball bonding copper-containing wires to a plurality of bond pads included within a plurality of microelectronic devices, the copper-containing wires comprised of a different material than are the plurality of bond pads;
   selecting at least one bond wire sample produced in conjunction with the plurality of microelectronic devices for ball bond integrity testing;
   testing the integrity of one or more ball bonds of the at least one bond wire sample, testing comprising:
      contacting one or more copper-containing wires of the at least one bond wire sample with a liquid copper etchant to separate the copper-containing wires from the bond pads and expose the wire-pad interfaces, the liquid copper etchant comprising a sulfate-based oxidizing agent, an acid different than the sulfate-based oxidizing agent, and a solvent; and
      estimating the percentage of the exposed wire-pad interfaces covered by intermetallic compounds; and
   packaging the plurality of microelectronic devices if the percentage of the intermetallic compounds exceeds the predetermined threshold value.

17. The method of claim 16 wherein each of the plurality of microelectronic devices and the at least one wire bond sample comprises a plurality of aluminum bond pads, and wherein the sulfate-based oxidizing agent comprises ammonium persulfate.

18. The method of claim 16 wherein the plurality of microelectronic devices comprise integrated circuits formed on semiconductor die.

19. The method of claim 16 wherein the plurality of microelectronic device comprise microelectromechanical systems devices.

20. A method for testing the integrity of wire bonds formed between copper-containing wires and the bond pads of a plurality of microelectronic devices, the bond pads of the plurality of microelectronic devices fabricated from a metallic material different than the copper-containing wires, the method comprising:
   selecting at least one wire bond sample produced in conjunction with the wire bonds formed between the copper-containing wires and the bond pads of the plurality of microelectronic devices;
   baking the at least one wire bond sample to promote the formation of intermetallic compounds at the wire-pad interfaces;
   applying a sulfate-containing etchant to the at least one wire bond sample at the wire-pad interfaces thereof until the copper-containing wires lift from the bond pads and expose the wire-pad interfaces;

generating at least one image of the exposed wire-pad interfaces; and analyzing the at least one image to estimate the percentage of the intermetallic compounds present at the exposed wire-pad interfaces and assess the integrity of the wire bonds formed between the copper-containing and the bond pads of the plurality of microelectronic devices.

* * * * *